United States Patent [19]
Nuxoll

[11] Patent Number: 5,842,272
[45] Date of Patent: Dec. 1, 1998

[54] APPARATUS FOR LOADING AND UNLOADING BURN-IN BOARDS

[75] Inventor: James P. Nuxoll, Boise, Id.

[73] Assignee: Micron Technology, Inc., Boise, Id.

[21] Appl. No.: 608,292

[22] Filed: Feb. 28, 1996

Related U.S. Application Data

[63] Continuation of Ser. No. 239,199, May 6, 1994, Pat. No. 5,509,193.

[51] Int. Cl.$^6$ ........................................................ H05K 3/30
[52] U.S. Cl. ................................ 29/739; 29/759; 29/760; 29/762; 324/765
[58] Field of Search .............................. 29/739, 741, 762, 29/740, 759, 760; 324/765

[56] References Cited

U.S. PATENT DOCUMENTS

| | | | |
|---|---|---|---|
| 4,817,273 | 4/1989 | Lape et al. | 29/741 |
| 5,093,984 | 3/1992 | Lape | 29/741 |

*Primary Examiner*—Carl E. Hall
*Attorney, Agent, or Firm*—Angus C. Fox, III

[57] ABSTRACT

An apparatus for rapidly and automatically handling packaged integrated circuits (ICs) during the loading or unloading of burn-in boards. The apparatus also segregates and offloads packaged ICs into a plurality of reservoirs for controlled delivery into suitable transport media on the basis of the level of functionality attained by each part during the burn-in process. The apparatus is computer controlled, with operator interface and an electronic control panel. The apparatus employs a linear induction motor drive system to rapidly, precisely and accurately move the ICs both between a loading/unloading location and a staging location, and at the staging location itself during the segregation and offloading steps. The system may be extended to operate in either the single or dual mode, employing two sorting and offloading components to unload a single device under test board. The apparatus uses an indexing table to controllably move an array of sockets on a burn-in board in a stepwise manner, such that one or more sockets (preferably a row of sockets) may be accurately located beneath insertion/extraction heads so that ICs may be sequentially loaded or sequentially unloaded. In one embodiment particularly applicable to burn-in boards having low-insertion-force sockets, extracted ICs are placed on a staging tray by gripper-type insertion/extraction heads. In another embodiment particularly applicable to burn-in boards having zero-insertion-force sockets, vacuum-type insertion/extraction heads are mounted on a support member which is coupled to the linear induction motor.

32 Claims, 13 Drawing Sheets

APPARATUS FOR LOADING AND UNLOADING BURN-IN BOARDS

This is a Continuation of U.S. patent application Ser. No. 08/239,199 filed on May 6, 1994, now U.S. Pat. No. 5,509,193.

FIELD OF THE INVENTION

This apparatus relates to an apparatus for controlled loading, unloading and handling of packaged integrated circuit (IC) devices from a burn-in board or other multi-socketed device-testing board.

BACKGROUND OF INVENTION

The physical and electrical integrity of monolithic integrated circuit devices are routinely ascertained at various stages of the manufacturing process. Although such circuit devices may be individually tested, it is much more efficient to test them in groups. A burn-in test is typically the last test to which an integrated circuit (IC) is subjected following encapsulation in a plastic or ceramic package, and prior to packing and shipment. Some ICs are shipped as bare die (i.e., unencapsulated). However, even the bare die must be burned in, and this is usually accomplished by placing each bare die in a temporary package. The burn-in test usually involves imposing controlled electrical and thermal stresses upon a group of packaged IC devices (also referred to as packaged ICs) which have been loaded into sockets on a burn-in board (BIB) and placed in a controlled environment. Upon completion of the burn-in test, fully-functional, partially-functional and nonfunctional IC devices are identified, the IC devices are unloaded from the burn-in board, and ICs are segregated on the basis of functionality, with the fully-functional and partially-functional IC devices being loaded into carrier containers for subsequent transfer or storage. The nonfunctional IC devices are generally scrapped.

The manner and means by which packaged IC devices are loaded and unloaded from a burn-in board or device-testing board (DTB) is the primary focus of this invention. In addition, a secondary focus of the invention is the manner and means by which the packaged IC devices are sorted and loaded into transport media.

Various devices and mechanisms have been developed in the industry to insert packaged IC devices into the sockets on burn-in boards, extract packaged IC devices from those sockets once the burn-in operation is complete, and sort the extracted packaged IC devices. One typical tool used to insert packaged IC devices into and extract packaged IC devices from low insertion force (LIF) sockets on burn-in boards consists of a pair of controllable, opposed, gripping fingers which grip opposite edges of the packaged IC device and then operate on the package in a direction orthogonal to the surface of the burn-in board so as to insert or extract the packaged IC device. SMC Pneumatics Corp. manufactures an "MHP Series" of pneumatically-operated gripping devices that are used to implement certain embodiments of the instant invention. Dual-in-line packages (DIP) and small outline J-lead packages (SOJ) are common IC packages which may be handled by such gripper devices. Pneumatic holding devices are used to load and unload zero-insertion-force sockets, and such holding devices are used to implement other embodiments of the instant invention.

BRIEF SUMMARY OF THE INVENTION

The inventive apparatus rapidly and automatically handles packaged integrated circuit (IC) devices during the loading or unloading of burn-in boards. The apparatus also segregates and offloads packaged IC devices into a plurality of reservoirs for controlled delivery into suitable transport media on the basis of the level of functionality attained by each part during the burn-in process. The apparatus is computer controlled, with operator interface and an electronic control panel. The apparatus employs a linear induction motor drive system to rapidly, precisely and accurately move the packaged IC devices both between a loading/unloading location and a staging location, and at the staging location itself during the segregation and offloading steps. The system may be extended to operate in either the single or dual mode, employing two sorting and offloading components to unload a single device under test board. The apparatus uses an indexing table to controllably move an array of sockets on a burn-in board in a stepwise manner, such that one or more sockets (preferably a row of sockets) may be accurately located beneath insertion/extraction heads so that packaged IC devices may be sequentially loaded or sequentially unloaded.

In one embodiment of the invention which is particularly applicable to burn-in boards having low-insertion-force sockets, extracted IC devices are placed on a staging tray by gripper-type insertion/extraction heads. Spacing of the packaged IC devices on the staging tray remains identical to that on the burn-in board. The staging tray is coupled to the linear induction motor so that it may be moved to a staging location where it is moved in a step-wise manner so that individual packaged IC devices are lined up with and propelled into one of multiple sorting tubes or bins which corresponds to the level of functionality determined for that particular IC device.

In another embodiment of the invention, which is particularly applicable to burn-in boards having zero-insertion-force sockets, vacuum-type insertion/extraction heads are mounted on a support member which is coupled to the linear induction motor. The unloaded packaged IC devices are then transported to the staging location attached to the insertion/extraction heads. As a head, in a step-wise manner, passes the sorting tube or bin associated with the level of functionality attributed to the packaged IC device which it is carrying, the IC device is released into the tube or bin.

In yet another embodiment of the invention, the sorter mechanism is made up of a plurality of vertically-stacked tubes which are moveable in a vertical plane so that each tube may be selectively aligned with an offloading path when a device having the performance characteristics associated with the selected tube is presented at the offloading path by the staging tray or support member.

DESCRIPTION OF A FIRST PREFERRED EMBODIMENT

Figure 1:
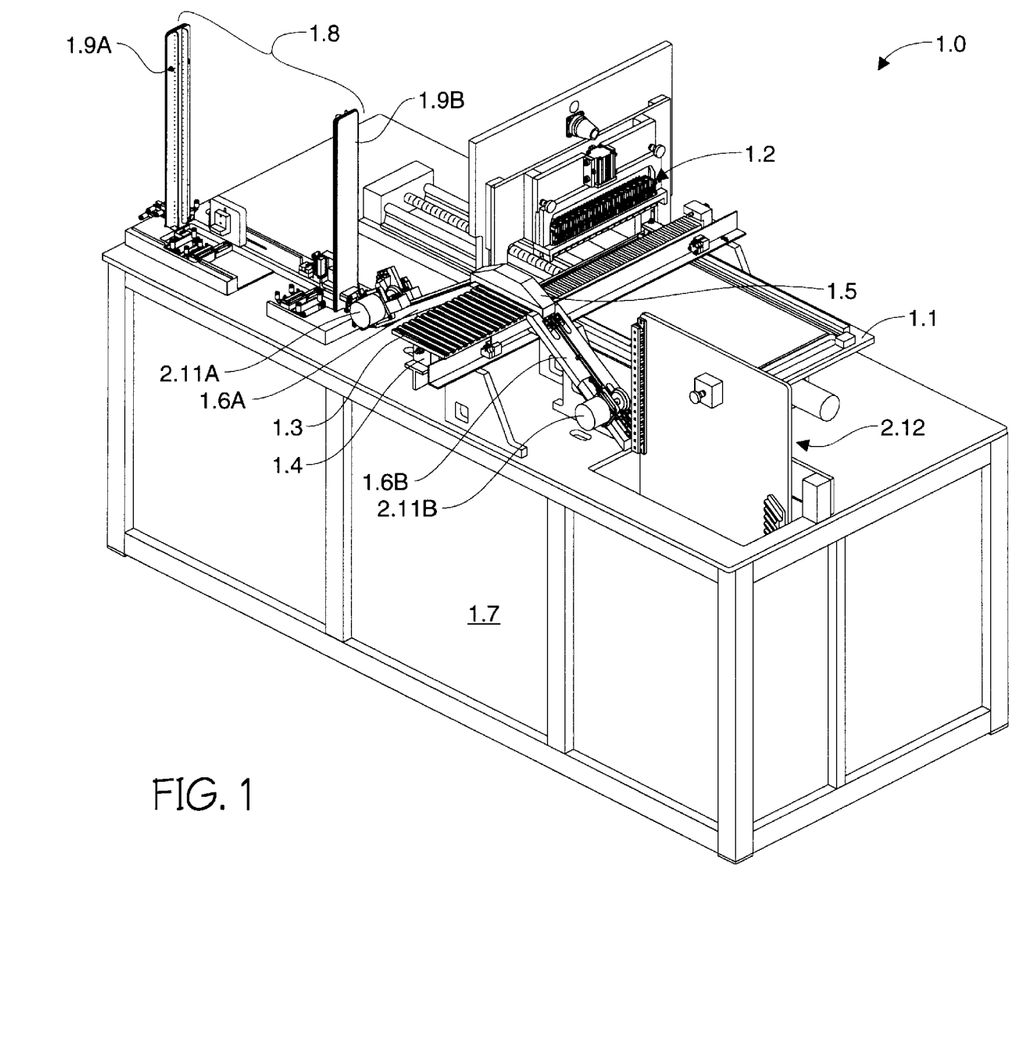
FIG. 1 is an isometric view of a first preferred embodiment of an apparatus for loading and un-loading DTB and offloading and sorting the unloaded devices.

FIG. 1 is an isometric view of a first preferred embodiment that is generally designated by the number 1.0. The automated computer controlled apparatus loading and unloading burn-in boards and for sorting and offloading unloaded parts is comprised of seven primary system components: (1) an indexing table assembly 1.1; (2) an IC device extraction assembly 1.2; (3) a staging tray assembly 1.3; (4) a linear induction motor 1.4; (5) an air jet impeller assembly 1.5; (6) one or more output track assemblies 1.6A and 1.6B; and (7) an integrated computer controller (not shown).

Still referring to FIG. 1, the preferred embodiment is housed in and is supported by a generally rectangular box shaped frame 1.7 having parallel vertical, opposing sides and upper and lower opposing horizontal surfaces. The upper horizontal surface generally supports and secures the working components of the apparatus and the space within the frame generally contains mechanical, electronic and pneumatic accessories (not shown), which are required to implement and empower the various components of the disclosed apparatus.

Figure 2A:
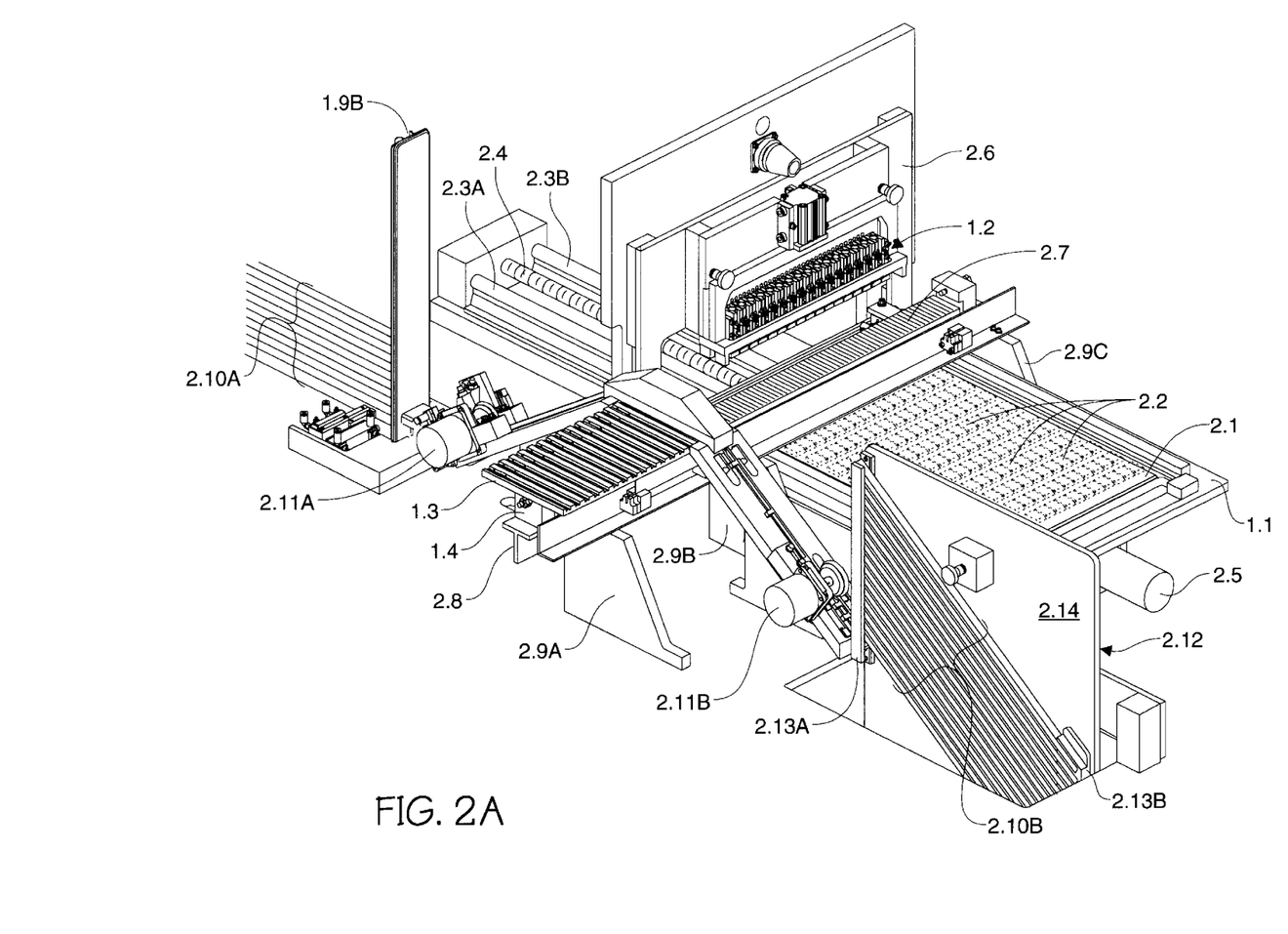
FIG. 2A is an isometric view of the assembled components of the first preferred embodiment of the apparatus, with a DTB installed thereon.

Referring now to FIG. 2A, the indexing table assembly 1.1 controllably and bidirectionally moves a removably attached burn-in board 2.1 in a stepwise manner during the extraction of the packaged IC devices which are removably installed in sockets 2.2 on the burn-in board 2.1. The indexing table assembly 1.1 comprises a generally rectangular, flat table which is configured to precisely, accurately, and removably secure the burn-in board 2.1 on its upper horizontal surface. The sockets 2.2 on the burn-in board 2.1 are normally arranged in a plurality of parallel rows and a plurality of parallel columns. A single packaged integrated circuit is removably installable in each socket 2.2. The indexing table 1.1 rests and moves, in rolling and confined contact, upon two parallel rails 2.3A and 2.3B which are fixedly mounted on the upper surface of the frame 1.7. The indexing table 1.1 is operably coupled to a computer-controlled worm gear assembly 2.4 which is driven by a conventional electric motor 2.5 and appropriate associated servomechanisms (not shown), which are housed within the supporting frame 1.7. The indexing table 1.1 is driven by the worm gear assembly 2.4 such that it moves horizontally and reciprocally, in a predetermined, stepwise manner on the rails 2.3A and 2.3B. Suitable, operably-connected sensors limit the travel of the indexing table 1.1 in both directions.

Figure 3:
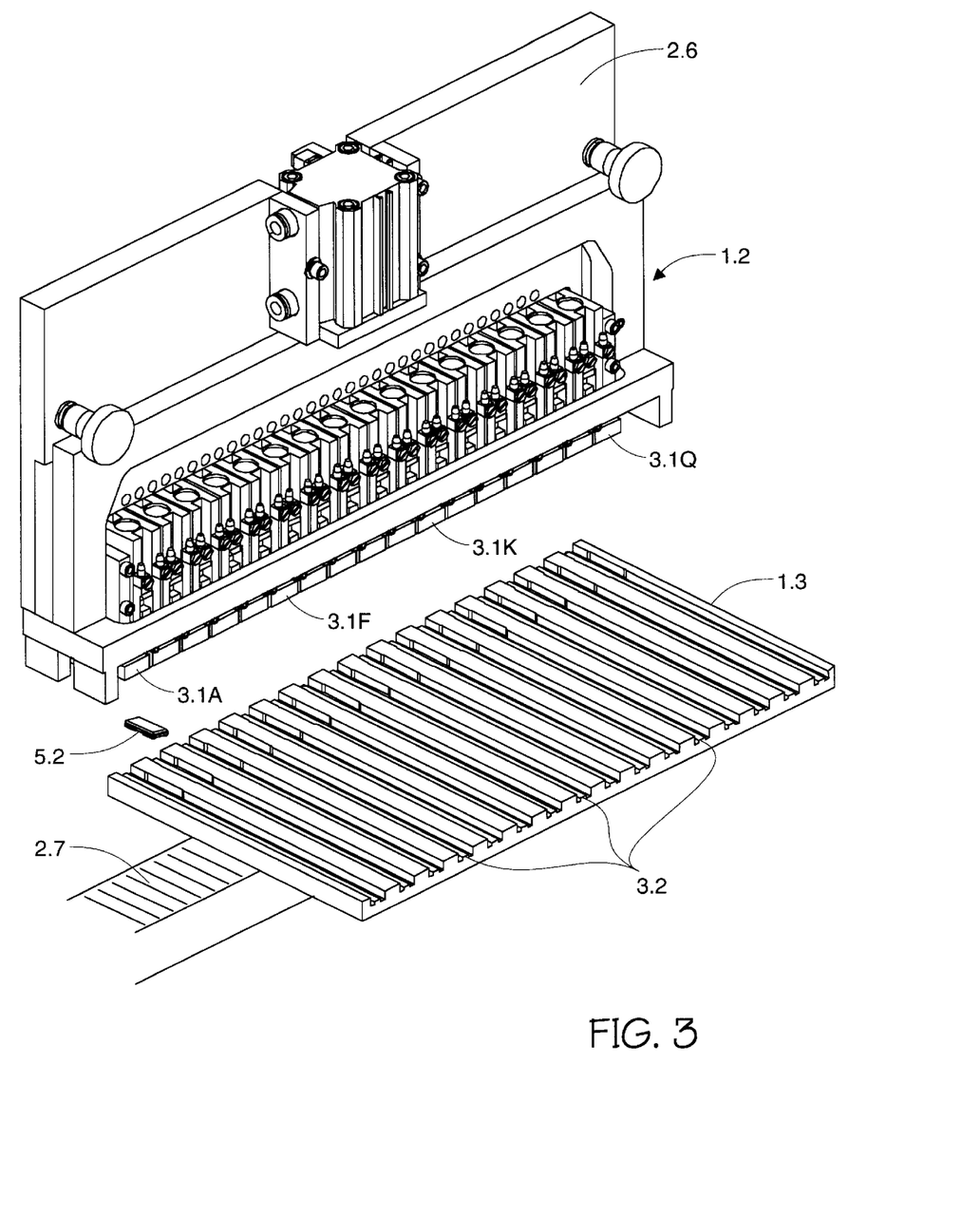
FIG. 3 is an exploded view of the packaged IC extraction means and a staging tray, with a packaged IC device being released to drop into the tray.

Referring now to FIG. 2A and FIG. 3, the IC device extraction assembly 1.2 is adjustably mounted on a movable support 2.6 which, in turn, is slidably mounted on a vertical mounting plate 2.7, which is attached to the upper surface of frame 1.7. The IC device extraction assembly 1.2 comprises a row of commercially-available gripper devices 3.1A–3.1Q. The row of gripper devices 3.1A–3.1Q is arranged in a vertical plane that is orthogonal to the burn-in board 2.1 and parallel to the rows of sockets thereon.

Figure 5A:
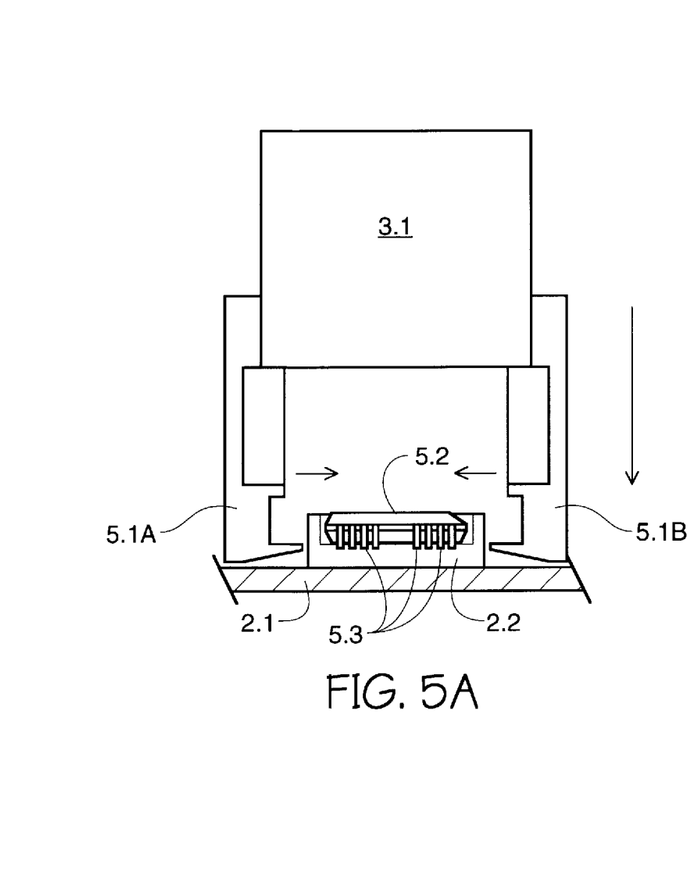
FIGS. 5A, 5B, 5C, and 5D are sequential side views of the grippers gripping and extracting packaged IC devices from the DTB, and then holding and depositing them onto the staging tray.

Referring now to FIG. 5A, each gripper device 3.1 has a pair of pneumatically-operated jaws 5.1A and 5.1B which are designed to grasp a packaged IC device 5.2. All gripper devices are pneumatically actuated in unison with the others in the row. Likewise, all gripper devices are raised and lowered simultaneously within the vertical plane by a pneumatic cylinder (not shown).

Referring once again to FIG. 3, the staging tray assembly 1.3 receives individual packaged IC devices 5.2 from the extraction assembly 1.2 and transports them to an offloading and sorting site. The staging tray assembly 1.3 is a generally rectangular shaped, flat plate having a plurality of identical parallel grooves 3.2, which extend from edge to opposing edge of the upper surface of the plate. The number of grooves 3.2 equal the number of gripper devices 3.1 in the extraction assembly 1.2, are spaced so as to conform to the spacing of the gripper devices 3.1 on the extraction assembly 1.2, and are shaped to receive a packaged IC device 5.2 in each slot. The dimensions of depth and width of the grooves 3.2 are selected to limit closely the position and orientation of the particular type of packaged IC device received so that the IC device may be precisely controlled by appropriate sensors and movers in their respective locations. The parallel grooves 3.2 are oriented orthogonal to the row of grippers 3.1A–3.1Q.

Referring once again to FIG. 2A, the linear induction motor drive assembly 1.4 comprises a moving element called the forcer (shown in FIG. 4), to which the staging tray 1.3 is rigidly affixed, and a stationary element called the platen 2.7. The forcer is slidably attached to the platen and rides on a cushion of pressurized air. The platen 2.7 is directly mounted to a T-bar 2.8, which functions as a bridge. The bridge is directly mounted to the support stands 2.9A, 2.9B, and 2.9C which, in turn, are rigidly affixed to the frame 1.7. In this particular case, support stand 2.9A is located beneath the offloading and sorting site, and two other support stands are located on opposite sides of the indexing table assembly 1.1. The platen 2.7 extends transversely above the indexing table 1.1, orthogonal to the direction of travel of the table and in a plane above and parallel to the upper surface of the indexing table.

Figure 4:
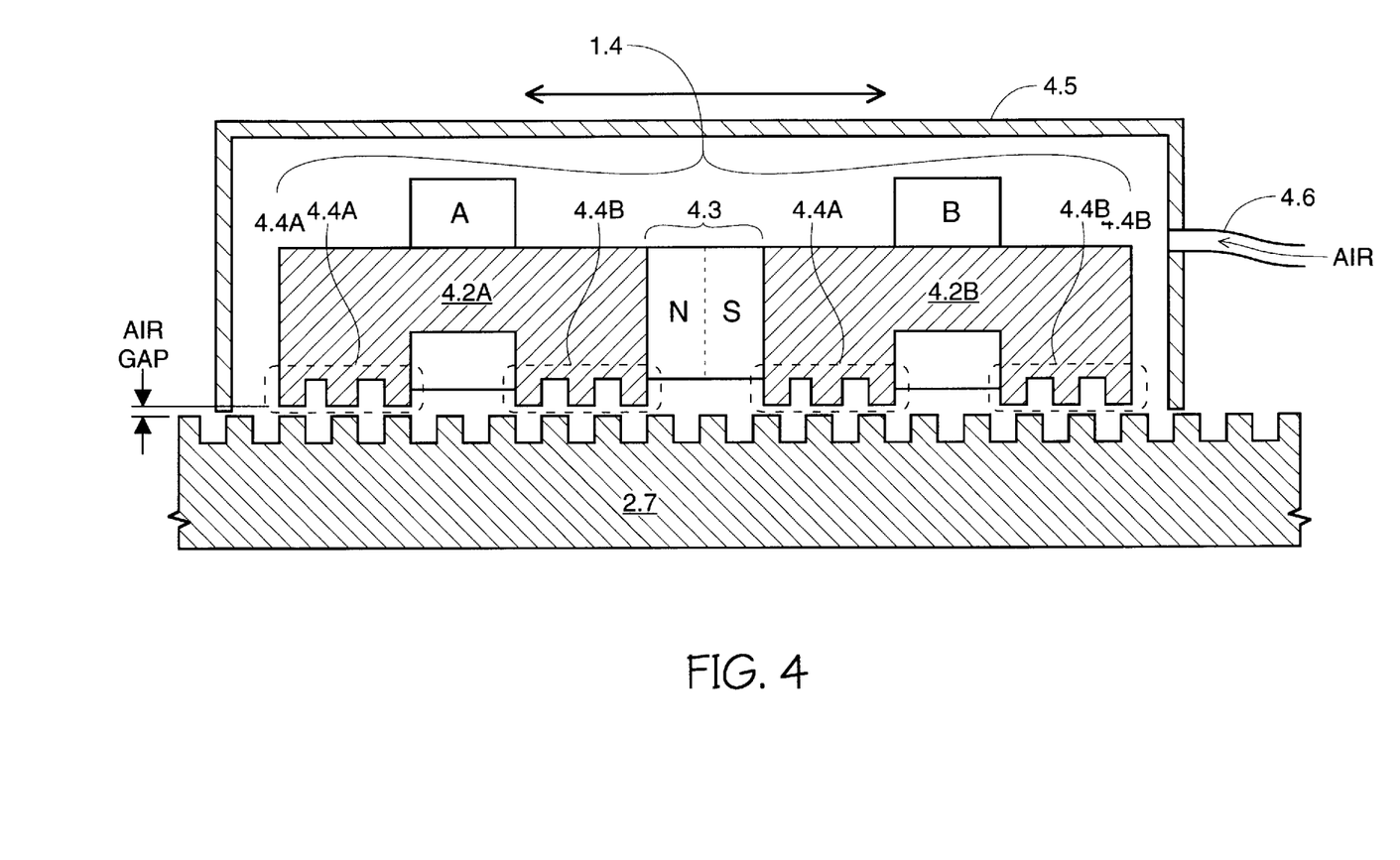
FIG. 4 is a side view of the linear induction motor drive assembly and the pneumatic air cushion assembly.

Referring now to FIG. 4 the moving element or forcer 4.1 incorporates two parallel electromagnets 4.2A and 4.2B, which are identical in design and configuration, and a strong rare earth magnet 4.3 which located proximate and between the two electromagnets. Each electromagnet 4.2 has a pair of toothed pole faces 4.4A and 4.4B, which concentrate the magnetic flux. The platen 2.7 is a passive toothed steel bar which extends over the desired length of travel. The teeth on the platen 2.7 and the electromagnet 4.2, although located in different planes, are parallel to one another. They are also parallel to the slots of the staging tray 1.3. The four sets of teeth on the forcer (two sets on each electromagnet) are spaced in quadrature so that only one set at a time can be aligned with the platen teeth as it moves along the platen. The air cushion bearing between the forcer 4.1 and the platen 2.7 is provided by an inverted, cup shaped, generally rectangular enclosure 4.5 which is open on the bottom and is removably and adjustably mounted above and integral with the forcer. This enclosure 4.5 has a pneumatic air inlet 4.6 on one side, operably connected to an air supply (not shown), through which pressurized air is introduced into enclosure 4.5. The pressurized air escapes between the sliding surfaces of the forcer 4.1 and the platen 2.7, thus creating the air cushion bearing between the forcer 4.1 and the platen 2.7 and preventing intimate contact between those two parts.

FIGS. 5A–5D detail the operation of a single gripper device 5.1 during the IC device unloading cycle.

Referring now to FIG. 5A, as the burn-in board is moved by the indexing table 1.1, row by row in a stepwise manner, beneath the IC device extraction assembly 1.2, the row of grippers is lowered within the vertical plane, with each gripper 3.1 having its jaws 5.1A and 5.1B in an open position.

Figure 5B:
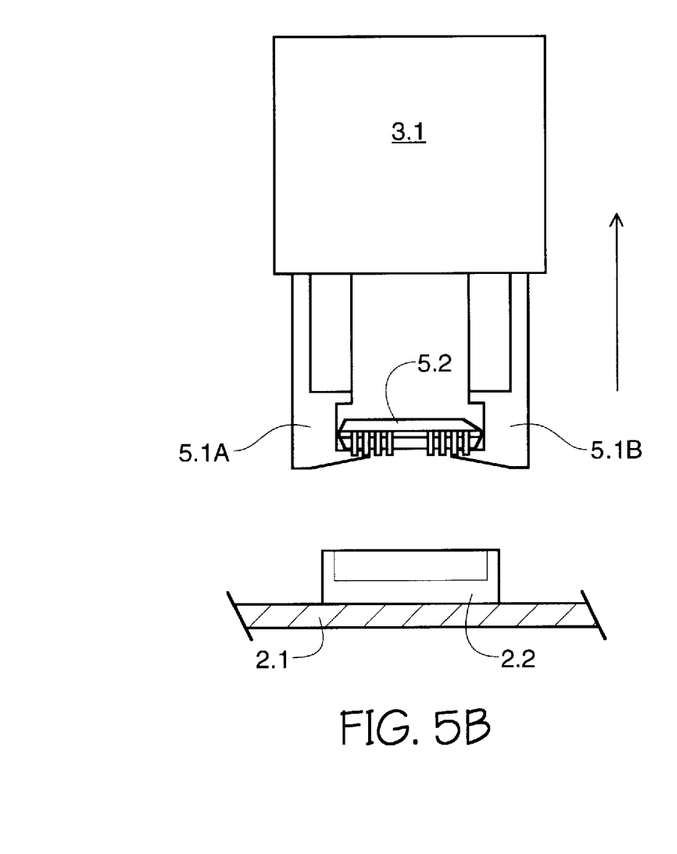

Referring now to FIG. 5B, upon reaching the lowest point of travel, the jaws are pneumatically closed so that each gripper device grasps a packaged IC device 5.2 that has been installed in the socket 2.2 with its leads 5.3 facing downward. The row of gripper devices 3.1 is then raised by the pneumatic cylinder, thus extracting an entire row of packaged IC devices from the burn-in board.

Figure 5C:
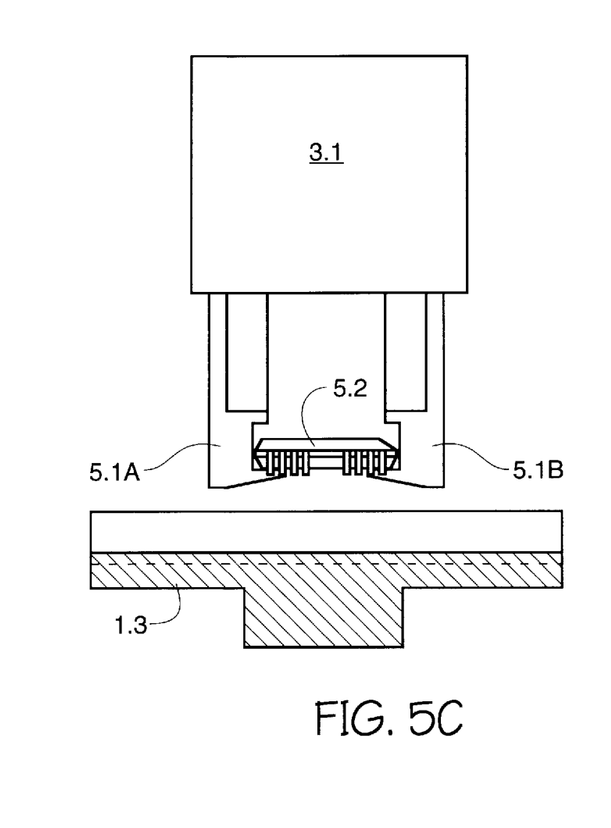

Referring now to FIG. 5C, the row of gripper devices 3.1 and the IC devices 5.2 held within the jaws of each gripper device 3.1 are raised to a level above the staging tray 1.3. Once so raised, the row of packaged IC devices is maintained in that position until the staging tray 1.3 is moved between the row of gripper devices 3.1 and the burn-in board 2.1 and positioned such that the grooves 3.2 in the staging tray 1.3 line up with the IC devices positioned above.

Figure 5D:
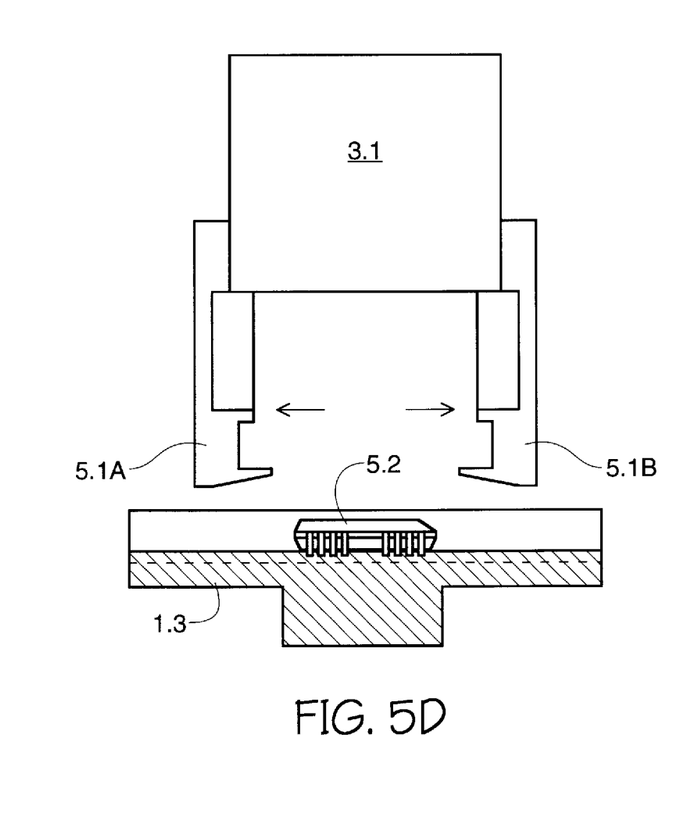

Referring now to FIGS. 3 and 5D, once the staging tray 1.3 is positioned below the row of elevated IC devices, the packaged IC devices are released by the gripper devices 3.1 into the grooves 3.2 of the staging tray 1.3.

Referring once again to FIG. 2A, the staging tray 1.3 moves in a horizontal plane that is above and parallel to the plane in which the burn-in board moves. The direction of movement of the staging tray is orthogonal to the direction of movement of the burn-in board.

Figure 6:
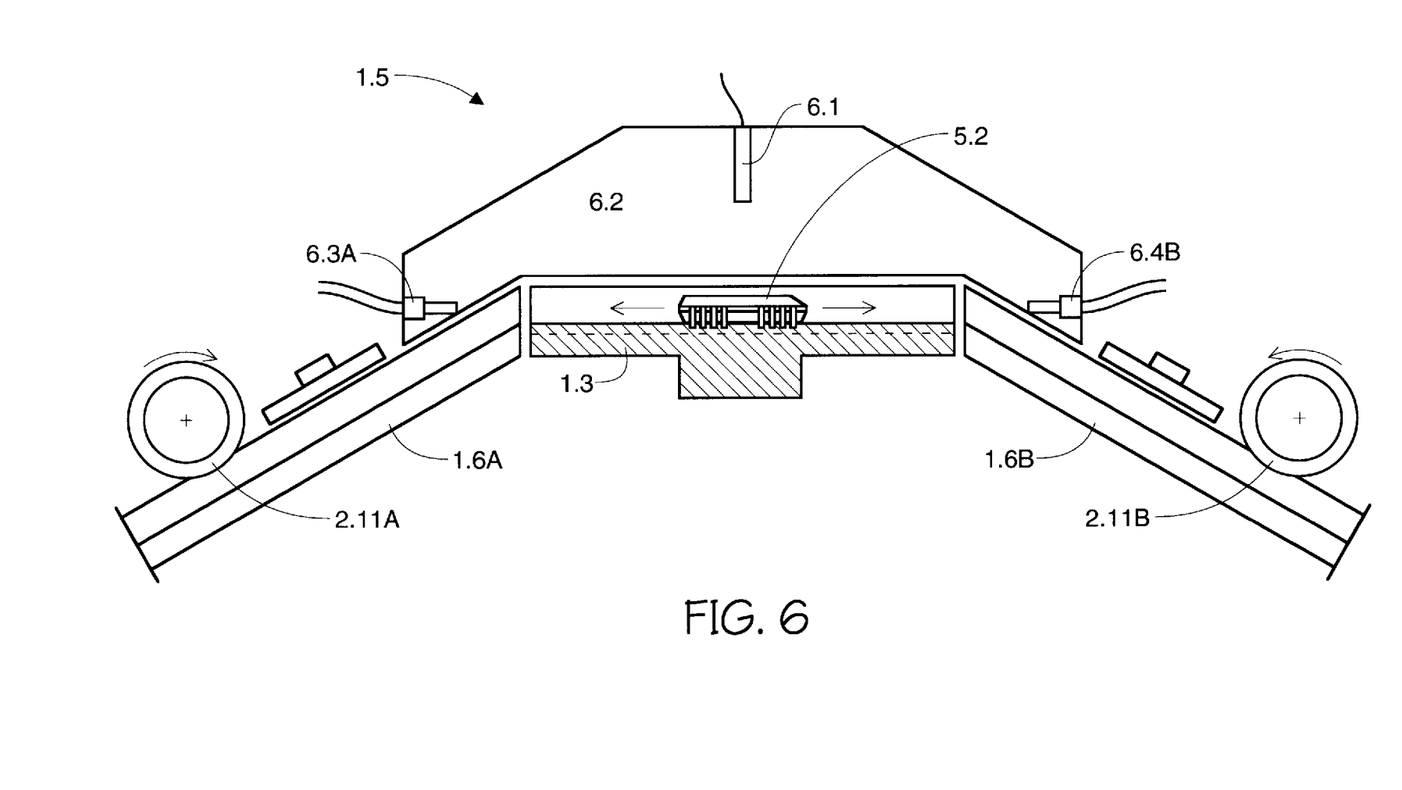
FIG. 6 is a side view of the offloaded IC device sorting mechanism.

Referring now to FIG. 6, the IC device position sensing means 6.1 senses an individual IC device 5.2 the staging tray 1.3. The IC device sensing means 6.1, which comprises a standard reflective photocell sensor that senses the presence or absence of an IC device upon the staging tray, is appropriately and adjustably mounted in a suitable housing 6.2. This housing is fixedly attached above and parallel to and proximate the path of the upper surface of the staging tray 1.3 which contains the IC devices 5.2 that have been extracted by the grippers and released upon the tray 1.3.

Still referring to FIG. 6, an air jet propulsion device 6.3A or 6.3B impels individual IC devices from their position on the staging tray 1.3 into selected output tubes or bins (see items 2.10A and 2.10B of FIG. 2A). The air jet propulsion devices 6.3A and 6.3B, of standard design, are adjustably mounted on each end of a housing 6.2 which sits atop the offloading track assemblies 1.6A and 1.6B. Each jet propulsion device 6.3 is operably and pneumatically connected to an air supply (not shown). The opposing air jets 6.3A and 6.3B are oriented to face one other, with the long axis of an individual staging tray slot 3.2 extending between them. When an IC device is sensed by the sensing means 6.1, a computer command is given to the air supply to activate the appropriate air jet 6.3A or 6.3B to displace the IC device into the track of the appropriate offloading track assembly 1.6A or 1.6B. The housing 6.2 is of generally rectangular shape and rigidly affixed to the offloading track assemblies 1.6A and 1.6B. The opposing ends of the housing 6.2 are appropriately shaped to enclose and guide an IC device as it leaves one of the opposing ends of the matching-tray slots and enters the upper end of one of the offloading track assemblies 1.6A or 1.6B. Each track extends outwardly, normal to the path of the staging tray and downwardly in the same vertical plane and in opposing directions from the proximate opposing sides of the staging tray. As seen in FIG. 2A, the opposing lower ends of the respective tracks are positioned proximate an open end of one of a plurality of appropriately oriented, suitably configured, commercially available, IC device carrier tubes 2.10A and 2.10B.

Referring once again to FIG. 1 and FIG. 2A, the opposing end of offloading track 1.6A is directed to a point on the upper surface of the supporting frame 1.7, proximate a standard carrier tube rack assembly 1.8. This rack assembly comprises a pair of vertical posts, 1.9A and 1.9B, each of which has a vertical slot which faces the opposite post. These slots are configured to closely confine the opposing ends of a single vertical stack of individual, empty carrier tubes 2.10A, with the stack of tubes being parallel, but offset from offloading track 1.6A. When a tube is required for offloading, the tube rack assembly 1.8 singulates the bottommost tube in the stack by moving it laterally so that, from a top plan view perspective, it is aligned with the offloading track 1.6A, with the open end thereof proximate the end of the offloading track 1.6A, and lowering the closed end of the singulated tube so that, from a side elevational view perspective, the tube is aligned with offloading track 1.6A.

Resting on the upper surface of the offloading track 1.6A, at the lower end thereof and adjustably and operably mounted thereon, is a commercial, customized singulation wheel assembly 2.11A (see also FIG. 6 for operational details) which detects, counts and singulates by rolling contact, each IC device as it slides down the off loading track 1.6A from the staging tray to a singulated carrier tube. When the computer controlled counter which is integral with the wheel detects that a predetermined number of IC devices have been loaded into a carrier tube, the loaded tube is automatically released so that it falls into a hopper. An empty carrier tube from the rack is then pneumatically positioned to replace the loaded tube. The operator periodically, as needed, replenishes the supply of empty carrier tubes in the rack assembly as they are filled during the operation of the apparatus.

In the preferred embodiment of the invention, offloading track 1.6A and tube rack assembly 1.8 are used to offload and receive IC devices that are identified during the testing sequence as being acceptable for shipment or further processing. Offloading track 1.6B, which extends outwardly and downwardly in the same vertical plane, but in the opposite direction from track 1.6A, is used to receive those IC devices identified during the previous testing phase of integrated circuit manufacture as unacceptable in some way. Track 1.6B has the same general design and dimension as track 1.6A, although either track may be modified to satisfy individual operational requirements. Offloading track 1.6B also has commercially available singulation wheel assembly 2.11B resting on the upper surface of the track, near the lower end and adjustably and operably mounted thereon, which detects, counts and singulates by rolling contact, each IC device as it moves from the staging tray to one of the carrier tubes in the stack of sloping carrier tubes 2.10B, which are installed on a sloping carrier tube rack assembly 2.12.

Each tube of the stack of sloping carrier tubes 2.10B is held on its opposing ends by two vertical, parallel tube racks 2.13A and 2.13B, which are adjustably mounted on opposing edges of one face of a flat, vertical, generally rectangular plate 2.14. Rectangular plate 2.14 is movable in the vertical plane by a commercially available motor driven, step wise operated, computer controlled worm gear assembly (not shown) located within frame 1.7. Thus, any of the tubes in the sloping stack 2.10B may be aligned with the offloading track 1.6B.

Each tube slot on rack assembly 2.12 is identified and classified by the computer to accept only computer designated kinds of unacceptable IC devices. Thus IC devices having different kinds of defects can be selectively delivered to one or more particular carrier tubes. It is to be understood that IC identification and classification occurs during the burn-in board testing phase prior to introduction of the burn-in board into the apparatus.

Figure 7A:
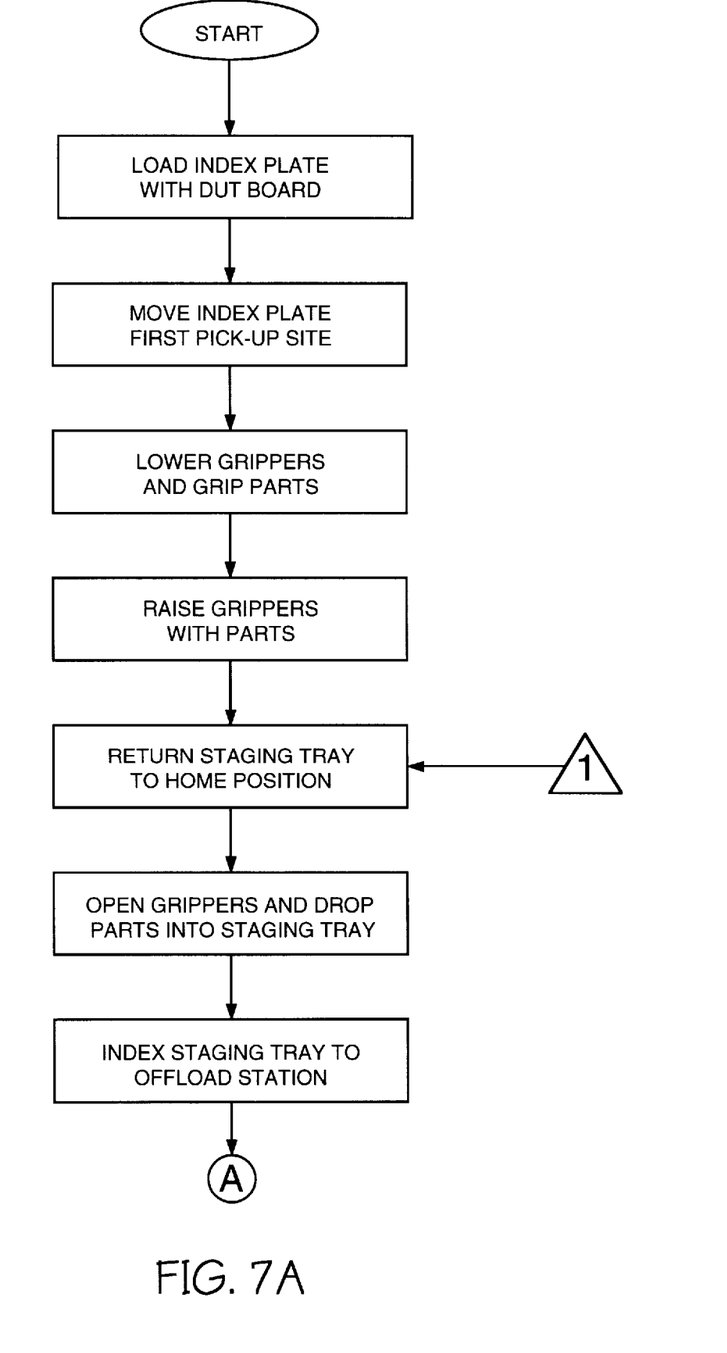
FIGS. 7A, 7B, 7C, and 7D show the operation logic of the first preferred embodiment of the side offloading and sorting system.
Figure 7B:
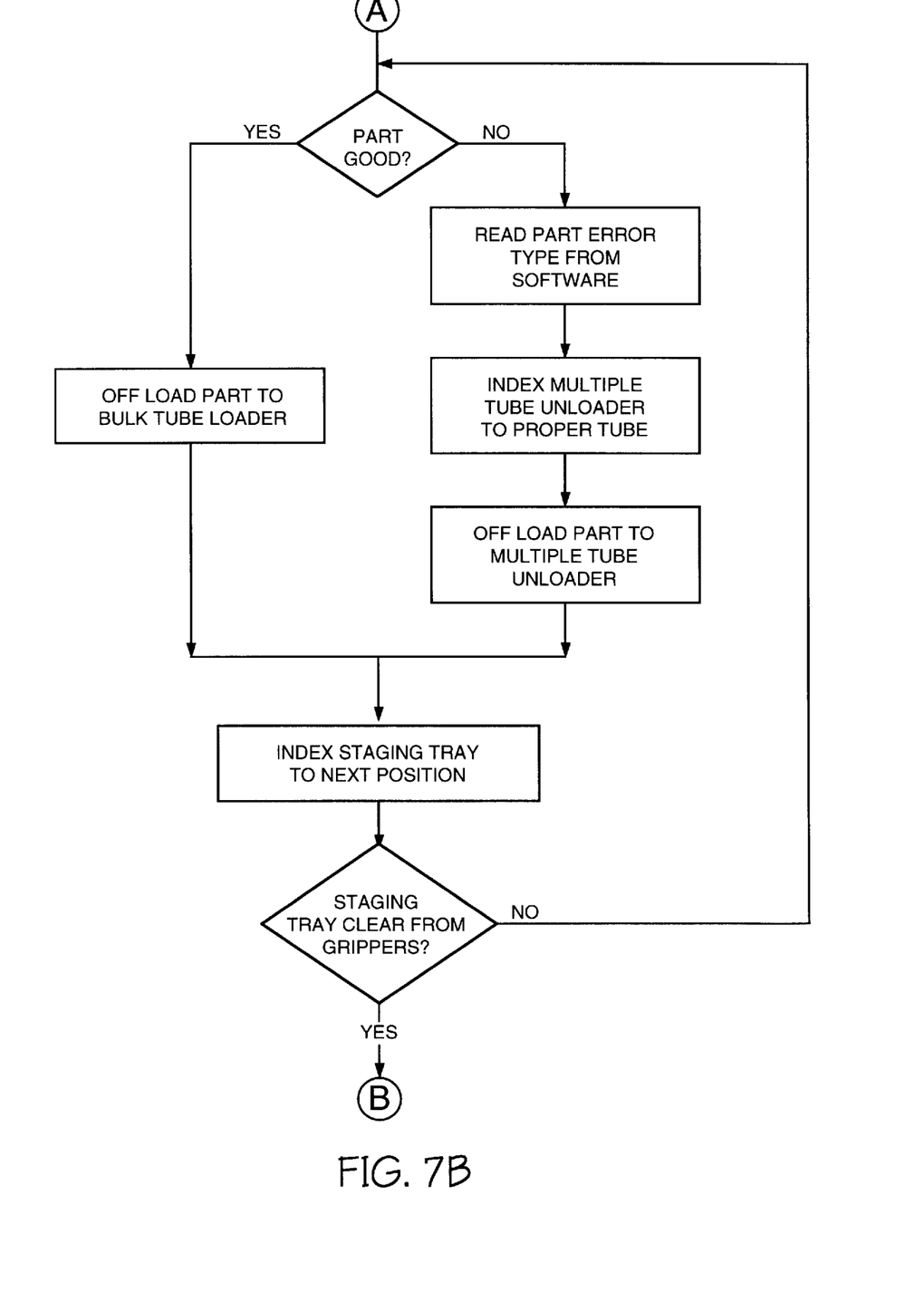
Figure 7C:
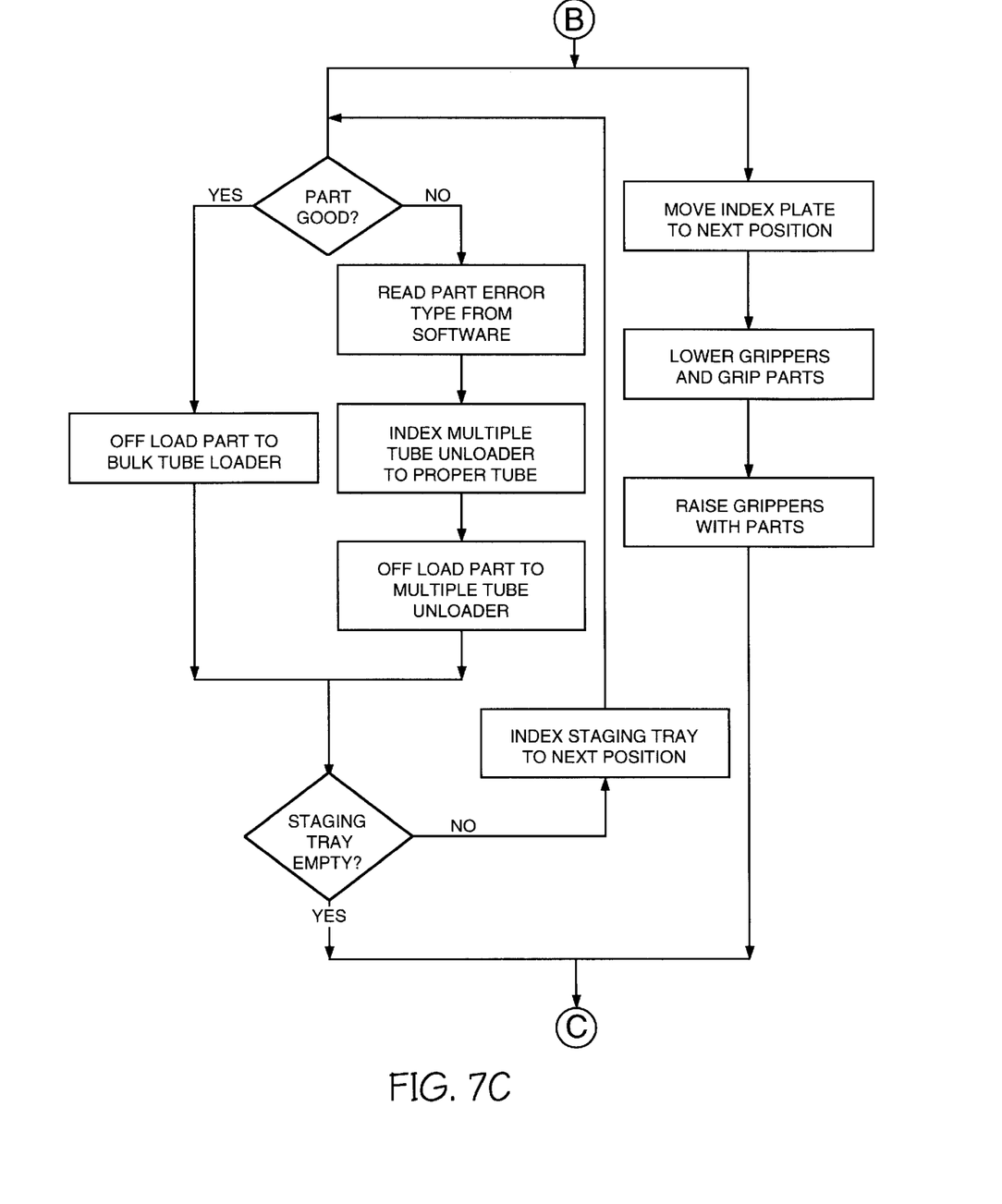
Figure 7D:
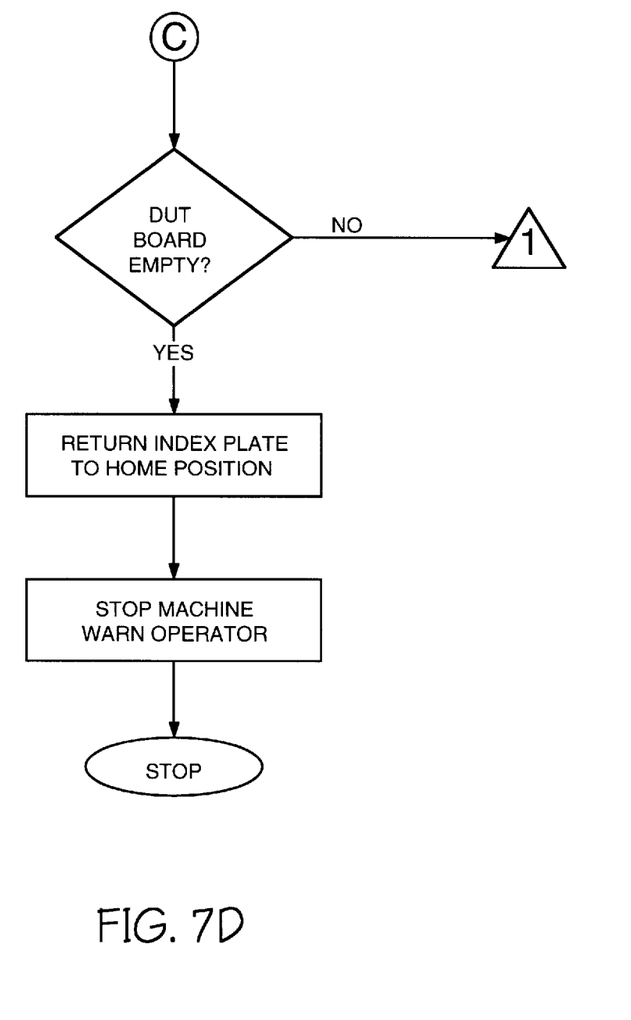

The integrated computer control means controls the operation of the apparatus, in cooperation with the operator. The operational sequence of the apparatus was discussed generally in the summary of the invention and more specifically in the above description of the first preferred embodiment. The operational logic of the first embodiment is shown in FIGS. 7A, B, C, D. The software necessary for the computer operation of the apparatus is designed to interface with the operator, to control all appropriate interrelated mechanical, electrical and pneumatic components and to process all relevant information concerning the integrity and number of IC devices being processed and to implement the sorting and storing of the IC devices in the designated carrier tubes.

DESCRIPTION OF THE SECOND PREFERRED EMBODIMENT

Figure 2B:
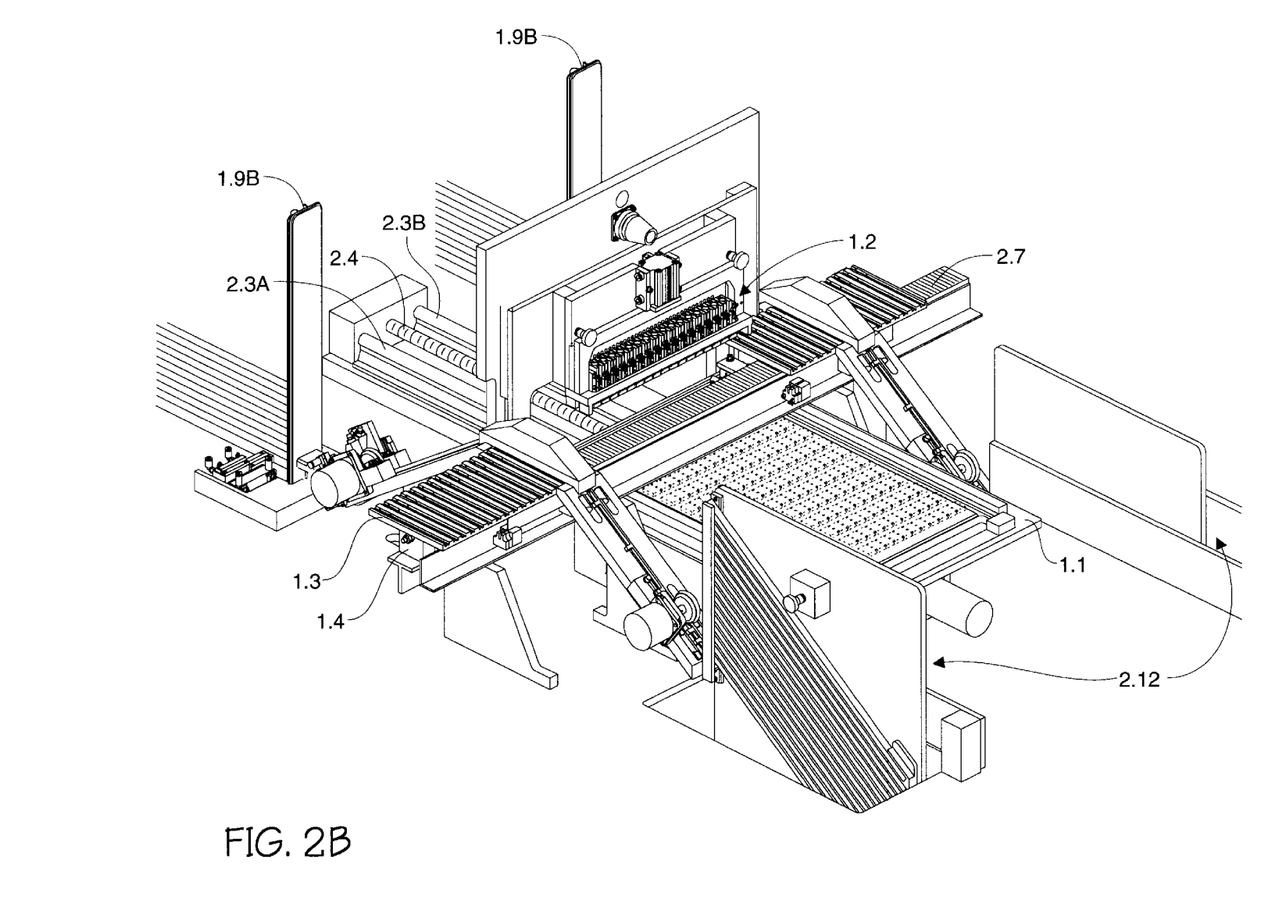
FIG. 2B is an isometric view of the assembled components of a second preferred embodiment of the apparatus with two staging trays and two offloading and sorting means.

FIG. 2B is an isometric view of a modified first embodiment which incorporates two offloading sites, one on each side of the burn-in board. The offloading sites are essentially mirror images of one another. Such a modified system permits the use of two staging trays in order to increase throughput.

The software of this dual system is designed to allow the two staging trays and sorting means to work together in the offloading and sorting of multiple burn-in boards. The software is also designed to allow either side of the apparatus to operate independently while the opposing side is closed down for loading and unloading of carrier tubes or system repair and maintenance or any other operational purpose.

The operational logic of the dual system is a straightforward extension of the logic of the single system shown in FIGS. 7A, 7B, 7C, and 7D. Provisions are also made for operation of each side individually, as mentioned above. The computer program is not considered a part of this invention but rather a convenient and efficient means for implementing the invention.

The present invention has been described in two preferred embodiments. Modifications and variations may become apparent to those skilled in the art. However the scope of the invention is not limited by the above described detail but only by the appended claims.

DESCRIPTION OF THE THIRD PREFERRED EMBODIMENT

Figure 8:
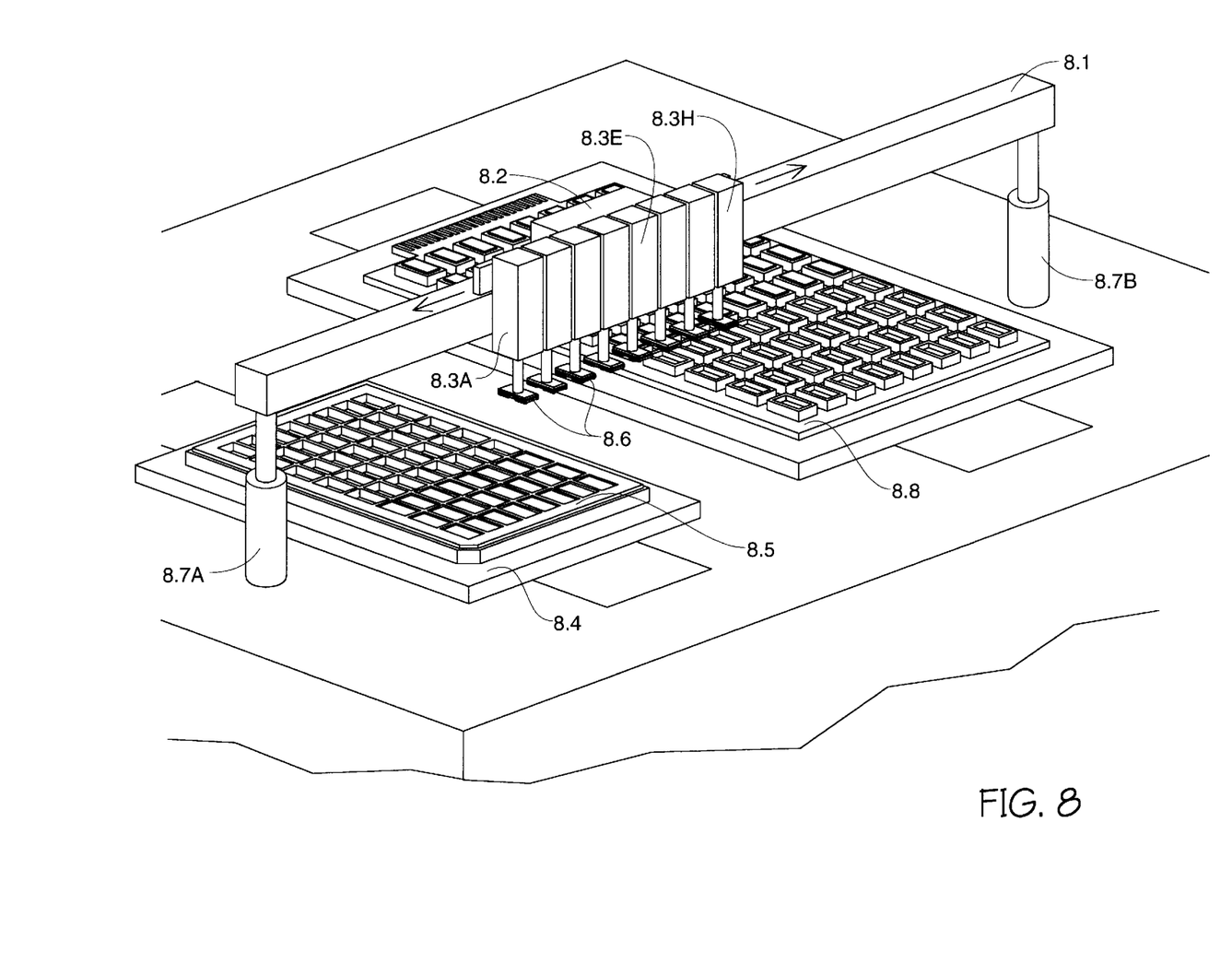
FIG. 8 is an isometric view of a third embodiment of the invention which employs pneumatic devices to retain and move packaged IC devices designed for zero-insertion force sockets.

Referring now to FIG. 8, a third embodiment of the invention features a linear induction motor having a platen 8.1, a forcer 8.2 on which vacuum extraction/loading heads 8.3A–8.3H are mounted, and an indexably movable platform 8.4 at a loading station. Vacuum extraction/loading heads are preferred for zero-insertion force type sockets. A carrying tray 8.5, having accurate locationing of stored parts, is shown mounted on the indexably movable platform 8.4. In this particular case, the vacuum heads 8.3 are ganged in a row, and spaced such that an entire row of IC devices 8.6 may be removed from the carrying tray 8.5 simultaneously. As the spacing is wider on the burn-in board 8.6 than for the carrying tray 8.5, the IC devices that were removed from the carrying tray 8.5 are deposited one at a time in sockets of a single row on the burn-in board. Such a procedure requires the forcer to execute eight move and stop sequences as individual IC devices are deposited into the eight sockets pertaining to individual rows on the burn-in board.

It should be noted that this type of arrangement could also be implemented with a gang of gripper-type devices and an elevable linear induction motor assembly. The supports 8.7A and 8.7B at opposite ends of the platen 8.1 may be fitted with slidable pistons which elevate the platen evenly when the extraction assembly must be raised. Such an arrangement can also utilize a single vacuum head or gripper instead of a multiple ganged heads or grippers.

It should also be noted that any of the three disclosed embodiments can be modified to load, as well as unload, burn-in boards. The process of loading is basically the reverse of unloading, with the sorting and off loading station replaced by an indexable carrying tray station such as that disclosed in the third embodiment section.

Although only several embodiments of the invention have been disclosed herein, it will be obvious to those having ordinary skill in the art of such equipment that changes and modifications may be made thereto without departing from the scope and the spirit of the invention as hereinafter claimed. In addition, it should be obvious to those of ordinary skill in the art that features of one embodiment may be incorporated in other embodiments, and that certain features are, therefore, not meant to be exclusive to one particular embodiment.

What is claimed is:

1. A machine for unloading packaged integrated circuit (IC) devices from sockets on a burn-in board, moving said IC devices to an intermediate location, and transferring the unloaded IC devices from the intermediate location to a staging location, said machine comprising:

(a) an indexing system for positioning at least one loaded socket on said board directly beneath said intermediate location;

(b) at least one extraction device for extracting an IC device from said socket and moving said IC device to said intermediate location; and (c) a transport system for transporting an extracted IC device from the intermediate location to the staging location, said transport system comprising a staging tray onto which each extracted IC device is placed at the intermediate location by said at least one extraction device, said staging tray being moveable between said intermediate location and said staging location.

2. The machine of claim 1, wherein said indexing system is an indexing table to which the burn-in board is removably affixed, said indexing table being precisely, accurately, and bidirectionally moveable in a plane parallel to the affixed burn-in board.

3. The machine of claim 1, wherein said extraction device comprises at least one pair of jaws which may be controllably closed to grip opposing sides of an IC device during the extraction of the IC device from a friction-contact-type socket and the moving of said IC device to said intermediate location, and opened to release said IC device upon arrival at said intermediate location.

4. The machine of claim 1, wherein said extraction device comprises a vacuum head which may be controllably activated to hold the IC device during extraction from a zero-insertion-force-type or clamshell-type socket and transport said IC device to said intermediate location, and deactivated to release said IC device upon arrival at said intermediate location.

5. The machine of claim 1, wherein said staging tray is slidably moveable and said transport system further comprises a linear induction motor coupled to said staging tray, said motor providing bidirectional linear motion to said staging tray between said intermediate location and said staging location.

6. The machine of claim 1, wherein said transport system comprises a support member to which said at least one extraction device is attached, said support member being moveable between said intermediate location and said staging location.

7. The machine of claim 6, wherein said support member is slidably moveable and said transport system further comprises a linear induction motor coupled to said support member, said motor providing bidirectional linear motion to said support member between said intermediate location and said staging location.

8. The machine of claim 1, wherein said staging location comprises means for loading said devices into transport media, said media being selected from the group consisting of device shipping trays and device shipping tubes.

9. The machine of claim 1, wherein said staging location comprises means for sorting unloaded IC devices into categories based on performance specifications.

10. The machine of claim 9, wherein said staging location further comprises means for loading sorted devices into transport media, said media being selected from the group consisting of device shipping trays and device shipping tubes.

11. The machine of claim 9, wherein said means for sorting comprises a plurality of vertically-stacked tubes which are moveable in a vertical plane so that each tube may be selectively aligned with a loading path when a device having the performance characteristics associated with the selected tube is presented at said path.

12. A machine for transferring packaged integrated circuit (IC) devices from a staging location to an intermediate location, moving said IC devices from said intermediate location and loading them into sockets on a burn-in board, said machine comprising:

(a) a transport system for transporting at least one IC device from the staging location to the intermediate location, said transport system comprising a staging tray onto which said at least one IC device is placed at the staging location, said staging tray being moveable between said staging location and said intermediate location;

(b) an indexing system for positioning at least one empty socket on said board directly below said intermediate location; and (c) at least one moving and insertion device for moving said IC device from said intermediate location and inserting said IC device into said empty socket.

13. The machine of claim 12, wherein said indexing system is an indexing table to which the burn-in board is removably affixed, said indexing table being precisely, accurately, and bidirectionally moveable in a plane parallel to the affixed burn-in board.

14. The machine of claim 12, wherein said moving and insertion device comprises at least one pair of jaws which may be controllably closed to grip opposing sides of an IC device during transport of said IC device from the intermediate location to said empty socket, during insertion of the IC device into a friction-contact-type socket, and which may be controllably opened to release said IC device once insertion is complete.

15. The machine of claim 12, wherein said moving and insertion device comprises a vacuum head which may be controllably activated to hold an IC device during both transport of said IC device from the intermediate location to said empty socket and insertion of the IC device into a zero-insertion-force-type or clamshell-type socket, and which may be controllably deactivated to release said IC device once insertion is complete.

16. The machine of claim 13, wherein said staging tray is slidably moveable and said transport system further comprises a linear induction motor coupled to said staging tray, said motor providing bidirectional linear motion to said staging tray between said staging location and said intermediate location.

17. The machine of claim 12, wherein said transport system comprises a support member to which said moving and insertion device is attached, said support member being moveable between said intermediate location and said staging location.

18. The machine of claim 17, wherein said support member is slidably moveable and said transport system further comprises a linear induction motor coupled to said support member, said motor providing bidirectional linear motion to said support member between said intermediate location and said staging location.

19. A machine for unloading packaged integrated circuit (IC) devices from sockets on a burn-in board, said sockets being arranged in a rows and columns, said machine comprising:

(a) a plurality of extraction devices for simultaneously extracting IC devices loaded in the sockets of an entire row and moving the extracted IC devices to an intermediate location, said extraction devices having a spacing equal to that of the sockets within each row;

(b) an indexing system for positioning loaded sockets of a single row directly beneath the extraction devices; and (c) a transport system for transporting the extracted IC devices from the intermediate location to a staging location, said transport system comprising a staging tray onto which extracted IC devices are placed at the intermediate location by said extraction devices, said staging tray being moveable between said intermediate location and said staging location.

20. The machine of claim 19, wherein said indexing system is an indexing table to which the burn-in board is removably affixed, said indexing table being precisely, accurately, and bidirectionally moveable in a plane parallel to the affixed burn-in board.

21. The machine of claim 19, wherein each extraction device comprises at least one pair of jaws which may be controllably closed to grip opposing sides of an IC device as it is extracted from a friction-contact-type socket and transported to the intermediate location, and controllably opened to release the IC device upon arrival at the intermediate location.

22. The machine of claim 19, wherein each extraction device comprises a vacuum head which may be controllably activated to hold an IC device as it is extracted from a zero-insertion-force-type or clamshell-type socket and transported to the intermediate location, and controllably deactivated to release the IC device upon arrival at the intermediate location.

23. The machine of claim 19, wherein said staging tray is slidably moveable and said transport system further comprises a linear induction motor coupled to said staging tray, said motor providing bidirectional linear motion to said staging tray between said intermediate location and said staging location.

24. The machine of claim 19, wherein said transport system comprises a support member to which the extraction devices are attached, said support member being moveable between said intermediate location and said staging location.

25. The machine of claim 24, wherein said support member is slidably moveable and said transport system further comprises a linear induction motor coupled to said support member, said motor providing bidirectional linear motion to said support member between said intermediate location and said staging location.

26. The machine of claim 19, wherein said staging location comprises means for removing the unloaded IC devices individually from said staging tray and thereby sorting the unloaded IC devices into categories based on performance specifications.

27. A machine for removing devices from arrayed positions on a board, moving said devices to an intermediate location, and transferring said devices from the intermediate location to a staging location, said machine comprising:
   (a) an indexing system for positioning at least one of the devices arrayed on the board directly beneath said intermediate location;
   (b) at least one device holder for transferring a device from its position on the board to said intermediate location; and
   (c) a transport system for transporting a device from the intermediate location to the staging location, said transport system comprising a staging tray onto which removed devices are placed by said at least one device holder at the intermediate location, and staging tray being moveable between said intermediate location and said staging location.

28. The machine of claim 27, wherein said staging tray is slidably moveable and said transport system further comprises a linear induction motor coupled to said staging tray, said motor providing bidirectional linear motion to said staging tray between said intermediate location and said staging location.

29. The machine of claim 27, wherein said transport system comprises a support member to which said at least one device holder is attached, said support member being moveable between said intermediate location and said staging location.

30. The machine of claim 29, wherein said support member is slidably moveable and said transport system further comprises a linear induction motor coupled to said support member, said motor providing bidirectional linear motion to said support member between said intermediate location and said staging location.

31. The machine of claim 27, wherein said staging location comprises means for removing the unloaded IC devices individually from said staging tray and thereby sorting the unloaded IC devices into categories based on performance specifications.

32. A machine for unloading packaged integrated circuit (IC) devices from sockets on a burn-in board, said sockets being arranged in a rows and columns, said machine comprising:
   (a) a plurality of extraction devices for simultaneously extracting IC devices loaded in the sockets of an entire row and moving the extracted IC devices to an intermediate location, said extraction devices having a spacing equal to that of the sockets within each row;
   (b) an indexing system for positioning loaded sockets of a single row directly beneath the extraction devices;
   (c) a transport system for transporting the extracted IC devices from the intermediate location to a staging location; and
   (d) a sorting system having multiple offloading paths at said staging location, said sorting system directing each extracted IC device to a selected offloading path.

* * * * *